(12) United States Patent
Rusanov et al.

(10) Patent No.: US 11,191,128 B2
(45) Date of Patent: Nov. 30, 2021

(54) METHOD FOR PRODUCING AN ELECTROMIGRATION-RESISTANT CRYSTALLINE TRANSITION-METAL SILICIDE LAYER, A CORRESPONDING LAYER SEQUENCE, AND A MICRO HEATER

(71) Applicant: Robert Bosch GmbH, Stuttgart (DE)

(72) Inventors: Radoslav Rusanov, Stuttgart (DE); Sabine Nagel, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 476 days.

(21) Appl. No.: 16/304,005

(22) PCT Filed: May 24, 2017

(86) PCT No.: PCT/EP2017/062537
§ 371 (c)(1),
(2) Date: Nov. 21, 2018

(87) PCT Pub. No.: WO2017/202907
PCT Pub. Date: Nov. 30, 2017

(65) Prior Publication Data
US 2020/0323041 A1    Oct. 8, 2020

(30) Foreign Application Priority Data
May 24, 2016   (DE) .......................... 102016208970.6

(51) Int. Cl.
*H05B 3/14*     (2006.01)
*H05B 3/16*     (2006.01)
(Continued)

(52) U.S. Cl.
CPC ............. *H05B 3/148* (2013.01); *G01N 27/16* (2013.01); *H05B 3/141* (2013.01);
(Continued)

(58) Field of Classification Search
None
See application file for complete search history.

(56) References Cited

U.S. PATENT DOCUMENTS 5,362,975 A * 11/1994 von Windheim .... G01N 27/129
  204/410
6,270,638 B1 * 8/2001 Kaneko ............... G01N 27/4065
  204/406
(Continued)

FOREIGN PATENT DOCUMENTS

EP    0375399 A2   6/1990
WO    0106496 A1   1/2001
WO    02080620 A1  10/2002

OTHER PUBLICATIONS

International Search Report dated Sep. 7, 2017 of the corresponding International Application PCT/EP2017/062537 filed May 25, 2017.

*Primary Examiner* — Joseph M. Pelham
(74) *Attorney, Agent, or Firm* — Norton Rose Fulbright US LLP; Gerard Messina

(57) ABSTRACT

A method for producing an electromigration-resistant crystalline transition-metal silicide layer of a layer sequence, for example, to provide a micro heater includes, supplying a semiconductor substrate including an electrically insulating layer; physically depositing a transition metal on the electrically insulating layer; carrying out a plasma-enhanced chemical vapor deposition while forming an inert gas plasma; conveying monosilane to the inert gas plasma, with the monosilane decomposing into silicon and hydrogen and the silicon in the gaseous phase entering into a chemical reaction with the transition metal in order to form the electromigration-resistant crystalline transition-metal silicide layer.

19 Claims, 4 Drawing Sheets

(51) Int. Cl.
*H05B 3/26* (2006.01)
*G01N 27/16* (2006.01)

(52) U.S. Cl.
CPC ............... *B81B 2201/0214* (2013.01); *B81C 2201/0181* (2013.01); *H05B 3/16* (2013.01); *H05B 3/265* (2013.01); *H05B 2203/017* (2013.01)

(56) References Cited

U.S. PATENT DOCUMENTS

| | | | | |
|---|---|---|---|---|
| 6,507,069 | B1* | 1/2003 | Zhang | H01L 27/1214 257/336 |
| 2002/0048531 | A1* | 4/2002 | Fonash | B81C 1/0038 422/68.1 |
| 2005/0101145 | A1* | 5/2005 | Visokay | H01L 21/823842 438/706 |
| 2009/0108382 | A1* | 4/2009 | Eriksen | G01L 9/008 257/419 |
| 2010/0072621 | A1* | 3/2010 | Fix | G01N 27/414 257/751 |
| 2010/0273289 | A1* | 10/2010 | Hung | H01L 27/1464 438/98 |
| 2014/0291410 | A1* | 10/2014 | Uemura | G01N 27/4067 236/46 R |

\* cited by examiner

METHOD FOR PRODUCING AN ELECTROMIGRATION-RESISTANT CRYSTALLINE TRANSITION-METAL SILICIDE LAYER, A CORRESPONDING LAYER SEQUENCE, AND A MICRO HEATER

CROSS-REFERENCE TO RELATED APPLICATIONS

The present application is the national stage of International Pat. App. No. PCT/EP2017/062537 filed can 24, 2017, and claims priority under 35 U.S.C. § 119 to DE 10 2016 208 970.6, filed in the Federal Republic of Germany on can 24, 2016, the content of each of which are incorporated herein by reference in their entireties.

FIELD OF THE INVENTION

The present invention relates to a method for producing an electromigration-resistant crystalline transition-metal silicide layer, a corresponding layer sequence and a micro heater.

BACKGROUND

Microelectromechanical devices on a metal-oxide basis, in particular sensors, including a micro heater are typically used for the detection and quantification of different gases. Such gas sensors typically require temperatures of at least 400° C. for their function.

As a rule, gas sensors on MEMS basis including micro heaters are realized in particular by a silicon-dioxide/nitride diaphragm, and such micro heaters have a transition-metal layer. A typical transition-metal layer used in such micro heaters can be platinum. Furthermore, such micro heaters are used in exhaust-gas sensors (particulate emission sensors, lambda probes), and can be exposed to temperatures of more than 700° C.

In addition, within the framework of an ongoing miniaturization, ever greater demands are placed on the reliability of such micro heaters, in particular on the transition-metal layer. As a result, an electromigration, in particular, is an especially relevant harmful mechanism, which can lead to a rapid failure of corresponding micro heaters on account of material-specific properties because the transition-metal layer becomes damaged by the electromigration.

A sensor having a micro bridge on which a heating element made of platinum is situated is known from the European patent EP 0 375 399.

SUMMARY

Example embodiments of the present invention are directed to a method for producing an electromigration-resistant crystalline transition-metal silicide layer, a layer sequence, and a micro heater.

The present invention concerns development of a transition-metal layer using a modified method that provides an electromigration-resistant crystalline transition-metal silicide layer, which furthermore can be stable at high temperatures and is suitable for use in micro heaters such as miniaturized MEMS sensors.

According to an example embodiment of the present invention, a method for producing an electromigration-resistant crystalline transition-metal silicide layer includes, in step A, the supply of a semiconductor substrate having an electrically insulating layer. For example, the semiconductor substrate can include silicon or silicon carbide. The electrically insulating layer can be an oxide layer of the semiconductor substrate. For instance, the semiconductor substrate can include silicon, and the electrically insulating layer can include a silicon-dioxide layer. More specifically, the semiconductor substrate can include monocrystalline silicon. As an alternative, the electrically insulating layer can encompass a material that differs from the material of the semiconductor substrate.

In step B of the method, a transition metal is physically deposited on the electrically insulating layer. The expression "physical deposition" refers to a physical vapor deposition. In contrast to chemical vapor deposition methods, the transition metal is transferred to the gaseous phase with the aid of physical methods, or in other words, is not vapor-deposited. The transition metal in the gaseous phase is then deposited, placed, or condensed on the electrically insulating layer. This particularly makes it possible to provide a high-temperature-stable transition-metal layer on the electrically insulating layer. The physically deposited transition metal can be suitable especially for use at temperatures of more than 700° C. and has a correspondingly low specific resistance.

In step C, a plasma-enhanced chemical vapor deposition is carried out under the formation of an inert gas plasma. In this type of chemical vapor deposition, the chemical deposition is enhanced by an inert gas plasma. The inert gas plasma described here is able to be ignited or produced directly at the transition metal to be coated.

In step D of the present method, monosilane ($SiH_4$) is conveyed into the inert gas plasma, and the monosilane ($SiH_4$) decomposes into silicon and hydrogen, with the silicon in the gaseous phase entering into a chemical reaction with the transition metal in order to form the electromigration-resistant crystalline transition-metal silicide layer. This means that the silicon in the gaseous phase diffuses into the transition metal. The chemical reaction for forming the electromigration-resistant crystalline transition-metal silicide layer is a self-terminating chemical reaction. In other words, the chemical reaction, in particular the diffusion, stops when the transition metal with the silicon in the gaseous phase has completely transitioned to the electromigration-resistant crystalline transition-metal silicide layer. As an alternative, amorphous silicon can subsequently develop, settle, or deposit on the electromigration-resistant crystalline transition-metal silicide layer by the excess silicon in the gaseous phase. Alternatively, the transition metal can regionally remain in the electromigration-resistant crystalline transition-metal silicide layer when the self-terminating chemical reaction is ended prematurely. The remaining transition metal can be developed on a side of the electromigration-resistant crystalline transition-metal silicide layer that is facing the electrically insulating layer.

The development of the amorphous silicon or the amorphous silicon layer is able to be adjusted by regulating corresponding process parameters, in particular the process time, during the plasma-enhanced chemical vapor deposition, in such a way that the plasma-enhanced chemical vapor deposition comes to a stop after the electromigration-resistant crystalline transition-metal silicide layer has formed.

The electromigration-resistant crystalline transition-metal silicide layer can include crystals that have an average particle size of between 100 nm and 200 nm.

In the following text, a "transition-metal silicide layer" is to be understood as the electromigration-resistant crystalline transition-metal silicide layer described herein.

The transition-metal silicide layer can especially be used at temperatures of more than 700° C. and has a correspondingly low specific resistance, with the result that the transition-metal silicide layer can be suitable for use in micro heaters for operating voltages between 0.5V and 12V, for example.

The material-specific properties of the transition-metal silicide layer described herein are in particular based on a combination of method steps B, C, and D in the described method sequence.

According to a preferred example embodiment, the transition metal includes platinum. For example, the transition metal can be made exclusively of physically deposited or sputtered platinum. Thus, the present method described here provides an electromigration-resistant crystalline platinum silicide layer which has a higher specific resistance than pure platinum on account of the individual method steps described herein, but is particularly suited to use in micro heaters in MEMS sensors because of the electromigration resistance and the high-temperature stability.

In addition, the transition material can include ruthenium, rhodium, palladium, and/or iridium and their alloys, in particular.

According to an example embodiment, the inert gas plasma is produced by an ignition of argon. This makes it possible to provide a stable argon plasma during the plasma-enhanced chemical vapor deposition, which reduces, especially considerably reduces, a consumption of monosilane for forming the transition-metal silicide layer.

According to an example embodiment, the physical deposition of the transition metal is carried out using DC magnetron sputtering, which allows for the deposition of a particularly electromigration-resistant and high-temperature stable transition-metal layer on the electrically insulating layer. A layer deposited with the aid of DC-magnetron sputtering including the transition metal is able to be taken into operation at temperatures of more than 700° C.

According to an example embodiment, a chamber pressure of between 1.5 Torr and 2.5 Torr is adjusted during the plasma-enhanced chemical vapor deposition, which is essentially attributable to the inert gas plasma. The chamber pressure can preferably be 2.0 Torr. This makes it possible to reduce the supply of monosilane for the formation of the transition-metal silicide layer.

According to an example embodiment, a temperature of between 700° C. and 900° C. is adjusted during the plasma-enhanced chemical vapor deposition. In this way the chemical reaction for forming the transition-metal silicide layer is able to be carried out in a particularly homogenous manner, and the stability of the corresponding layer becomes greater.

According to an example embodiment, the electromigration-resistant crystalline transition-metal silicide layer is tempered at a temperature of more than 900° C. This allows for an additional increase in the temperature stability of the electromigration-resistant crystalline transition-metal silicide layer.

According to an example embodiment, dinitrogen monoxide ($N_2O$) is additionally supplied in step D, with the result that the electromigration-resistant crystalline transition-metal silicide layer has greater porosity. This allows for a further increase in the specific resistance of the transition-metal silicide layer. Moreover, higher piezoresistivity is achievable in the transition-metal silicide layer because of the greater porosity. A transition-metal silicide layer produced in this manner is able to be used in pressure sensors, in particular.

Using the method described here, transition-metal silicide layers having thicknesses of more than 500 nm are able to be produced. After the silicon in the gaseous phase has fully reacted with the physically deposited transition metal such as platinum, a silicon-dioxide layer can directly form as a passivation on the transition-metal silicide layer, e.g., the platinum-silicide layer, especially without any loss of vacuum in the reaction chamber.

A example embodiment of the present invention is directed to a layer sequence produced using the method described here.

According to an example embodiment, the present invention relates to a micro heater which has an electromigration-resistant crystalline transition-metal silicide layer produced according to the method described herein, with a patterning of the electromigration-resistant crystalline transition-metal silicide layer being carried out using ion-beam etching with a photolithographic mask. The micro heater can particularly be used in microelectromechanical devices such as MEMS sensors, for example. Additional features and advantages of the present invention will be described in the following text on the basis of example embodiments with reference to the figures.

DETAILED DESCRIPTION

Figure 1:
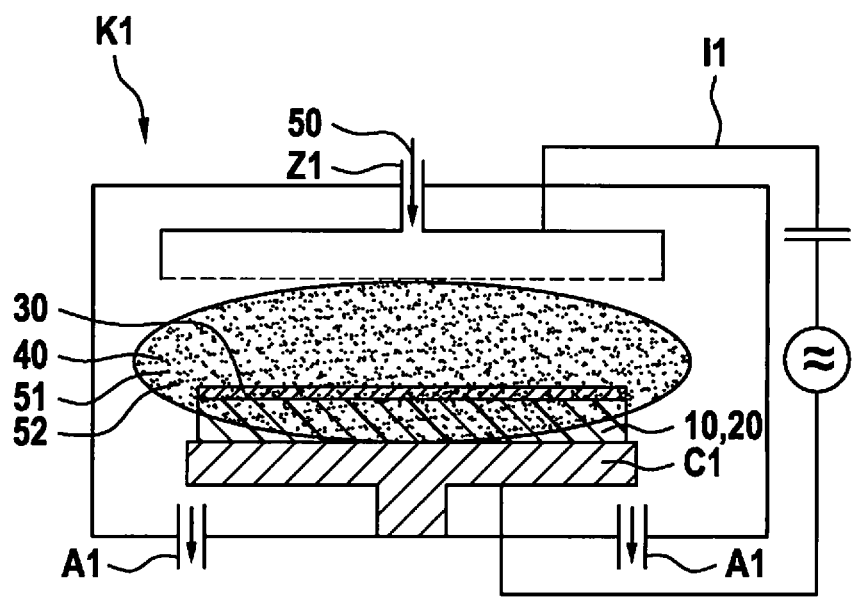
FIG. 1 is a schematic representation of a reaction chamber for carrying out a method for producing an electromigration-resistant crystalline transition-metal silicide layer.

Identical reference numerals in the figures denote identical or functionally equivalent elements.

FIG. 1 shows a schematic representation of a reaction chamber for carrying out a method for producing an electromigration-resistant crystalline transition-metal silicide layer.

Reference numeral K1 in FIG. 1 denotes the reaction chamber in which the present method for producing electromigration-resistant crystalline transition-metal silicide layer 60 is able to be carried out. In FIG. 1, transition-metal silicide layer 60 is not shown because FIG. 1 illustrates an initial state of an inert gas plasma 40. In other words, a chemical reaction between silicon 51 in the gaseous phase and transition metal 30 has not yet taken place in FIG. 1. Monosilane 50 in inert gas plasma 40 has already decomposed into its components silicon 51 and hydrogen 52. Monosilane 50 is able to be supplied via a supply opening Z1 of reaction chamber K1. Excess monosilane or components of the inert gas plasma can be discharged from reaction chamber K1 or pumped out of it via outlet openings A1. A high-frequency generator I1 is able to be switched on in order to ignite the inert gas plasma.

Figure 2:
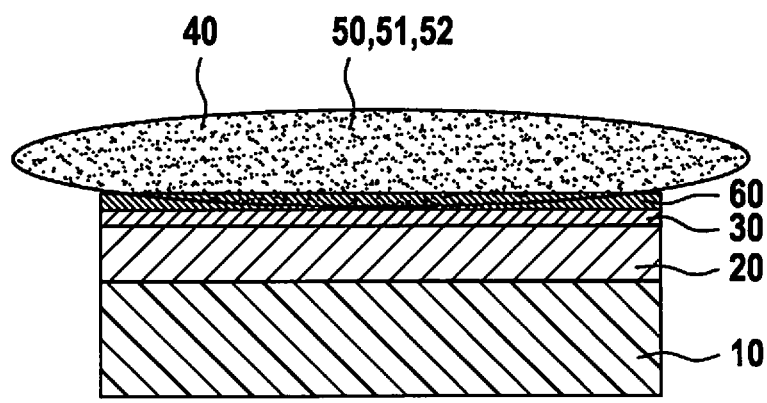
FIG. 2 is a schematic cross-sectional view of a layer stack, which is made available or produced in the course of a method for producing an electromigration-resistant crystalline transition-metal silicide layer, according to an example embodiment of the present invention.

The reaction chamber has a holder C1 on which a semiconductor substrate 10 having an electrically insulating layer 20 is situated (see FIG. 2). A physically deposited transition metal 30 or a physically deposited transition-metal layer 30 is situated on electrically insulating layer 20.

FIG. 2 shows a schematic cross-sectional view of a layer stack, which is provided or produced in the course of a method for producing an electromigration-resistant crystalline transition-metal silicide layer, according to an example embodiment.

In step A of the present method, semiconductor substrate 10 including electrically insulating layer 20 is supplied. In step B of the present method, a transition metal 30 is physically deposited on electrically insulating layer 20. In step C of the present method, a plasma-enhanced chemical vapor deposition is carried out while an inert gas plasma 40 is formed. In step D of the present method, monosilane 50 is conveyed to inert gas plasma 40, monosilane 50 decomposing into silicon 51 and hydrogen 52, and silicon 51 in the gaseous phase entering into a chemical reaction with transition metal 30 in order to form electromigration-resistant crystalline transition-metal silicide layer 60.

Figure 3A:
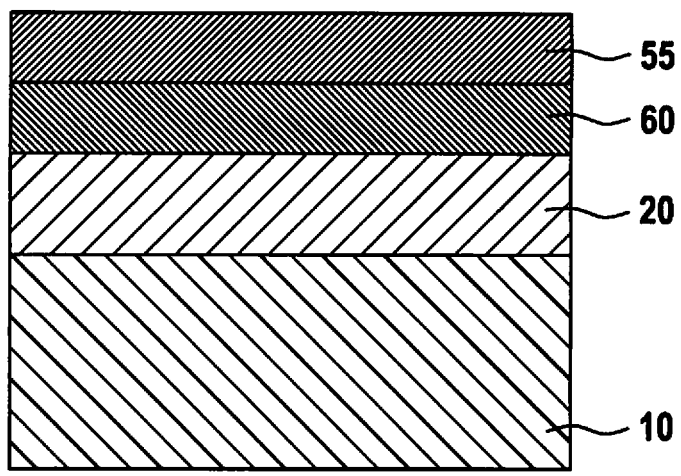
FIGS. 3a and 3b are schematic cross-sectional views of a layer stack based on a method according to the example embodiment of FIG. 2.
Figure 3B:
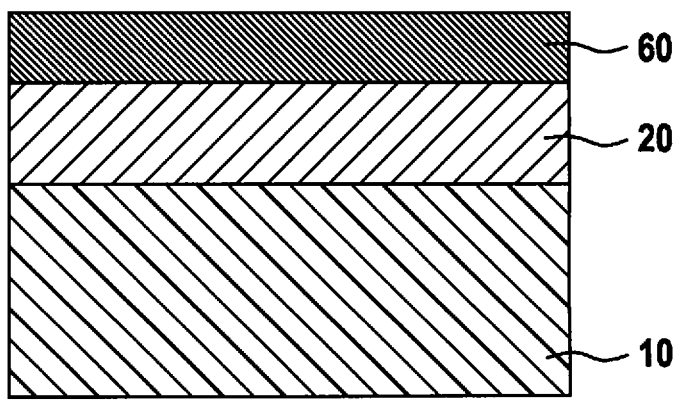

FIGS. 3a and 3b illustrate schematic cross-sectional views of a layer stack formed using this method. FIG. 3a shows a result of the production of transition-metal silicide layer 60 after transition metal 30 or transition-metal layer 30 has fully reacted with silicon 51 in the gaseous phase. An amorphous silicon layer 55 on the basis of silicon 51 in the gaseous phase can then be deposited on transition-metal silicide layer 60. This particularly takes place while maintaining the vacuum in reaction chamber K1. Amorphous silicon 55 or amorphous silicon layer 55 can either be etched off or a process time during the plasma-enhanced chemical vapor deposition can be adjusted in such a way that the present method for producing transition-metal silicide layer 60 is terminated shortly before transition metal 30 is depleted so that no amorphous silicon is created (see FIG. 3b).

Figure 4A:
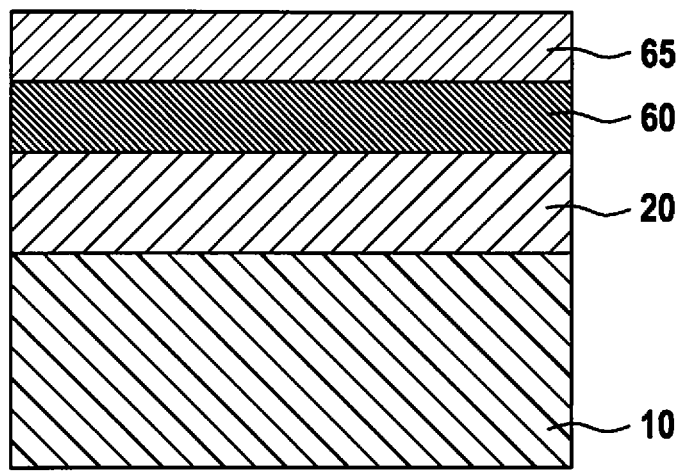
FIGS. 4a and 4b are schematic cross-sectional views of a layer stack based on a method according to another example embodiment of the present invention.
Figure 4B:
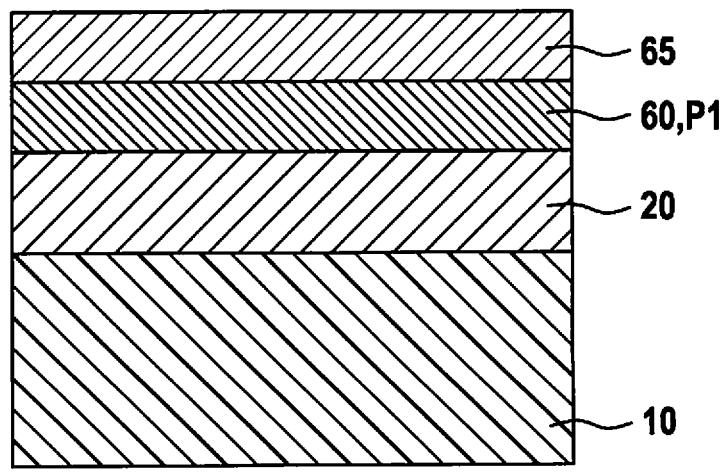

One possible implementation of the present method for producing transition-metal silicide layer 60:
System: Oxford PL100 PECVD reactor
Pressure/temperature: 2 Torr/800° C.
Inert gas plasma output: 50 W
Monosilane ($SiH_4$) flow/argon flow: 14 sccm/500 sccm
Duration: 10 minutes FIGS. 4a and 4b show schematic cross-sectional views of a layer stack based on a method according to another example embodiment. In FIG. 4a, after transition-metal silicide layer 60 has been produced, dinitrogen monoxide ($N_2O$) is conveyed into reaction chamber K1, which causes a silicon-dioxide layer 65 or silicon dioxide 65 to form on transition-metal silicide layer 60. Silicon-dioxide layer 65 can function as a passivation. If dinitrogen monoxide is conveyed into reaction chamber K1 or supplied to inert gas plasma 40 during the formation of transition-metal silicide layer 60, then transition-metal silicide layer 60 has a porosity P1. Silicon-dioxide layer 65 automatically deposits after transition metal 30 has been depleted. Silicon-dioxide layer 65 can either be etched away or a process time during the plasma-enhanced chemical vapor deposition is able to be adjusted in such a way that the method for producing transition-metal silicide layer 60 is terminated shortly before transition metal 60 has been depleted so that no silicon-dioxide layer 65 is created.

One possible implementation of the method for producing transition-metal silicide layer 60:
System: Oxford PL100 PECVD reactor
Pressure/temperature: 2 Torr/800° C.
Inert gas plasma output: 50 W
Monosilane ($SiH_4$) flow/$N_2O$ flow/argon flow: 14 sccm/233 sccm/500 sccm
Duration: 14 minutes FIG. 5 shows a schematic plan view of a microelectromechanical device having a micro heater based on a layer stack according to one of the example embodiments described here.

Figure 5:
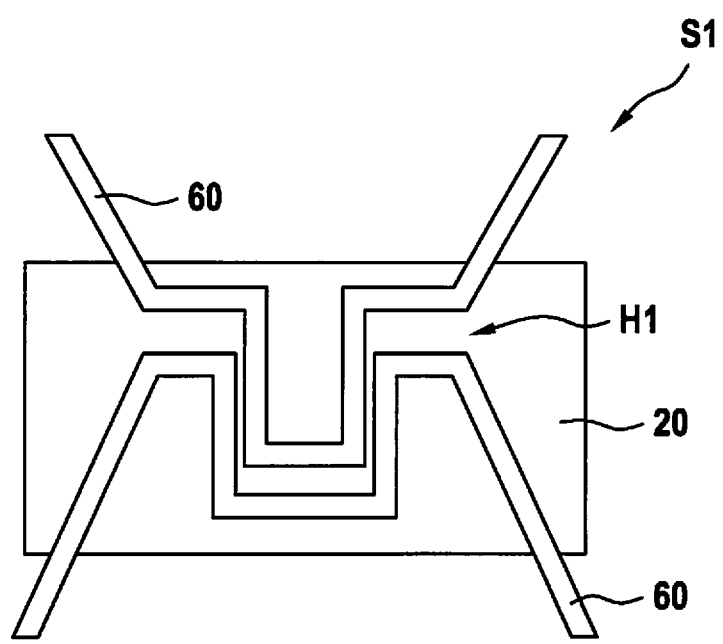
FIG. 5 is a schematic plan view of a microelectromechanical device having a micro heater based on a layer stack according to an example embodiment of the present invention.

Reference numeral S1 in FIG. 5 denotes a microelectromechanical device such as a MEMS sensor. Microelectromechanical device S1 includes a micro heater H1 having the electromigration-resistant crystalline transition-metal silicide layer 60 produced according to the method described here, and patterning of electromigration-resistant crystalline transition-metal silicide layer 60 is able to be carried out using ion-beam etching with a photolithographic mask. Micro heater H1 described herein has a very low electromigration and is stable at high temperatures. These material-specific characteristics of the micro heater are based on the method for producing electromigration-resistant crystalline transition-metal silicide layer 60 described herein.

A use of microelectromechanical device S1 with micro heater H1 including electromigration-resistant crystalline transition-metal silicide layer 60 is possible in the following products, for example:
- as an element of a gas sensor module in a smartphone/tablet;
- as a gas-sensor element in a "stand-alone" accessory featuring a Bluetooth connection to the smartphone, for example;
- as a sensor element in a smart-home sensor element for home applications;
- as a sensor element in further sensor-node applications;
- in a MEMS-based lambda sensor for automotive applications;
- in general, in MEMS elements which require a thin-film heater; and/or
- in some other sensor which requires a piezo-resistive layer (e.g., a pressure sensor).

Although the present invention has been described on the basis of preferred exemplary embodiments, it is not restricted to such. In particular, the mentioned values and systems are merely of an exemplary nature and are not restricted to the described examples.

What is claimed is:

1. A method comprising:
supplying a semiconductor substrate that includes an electrically insulating layer;
depositing, with a physical deposition process, a transition metal onto the electrically insulating layer;
carrying out a plasma-enhanced chemical vapor deposition while forming an inert gas plasma; and
conveying monosilane (SiH4) to the inert gas plasma, thereby decomposing the monosilane into:
  (a) hydrogen; and
  (b) silicon in a gaseous state in which the silicon chemically reacts with the transition metal, thereby forming an electromigration-resistant crystalline transition-metal silicide layer.

2. The method of claim 1, wherein the transition metal includes platinum.

3. The method of claim 1, further comprising producing the inert gas plasma by igniting argon.

4. The method of claim 1, wherein the deposition of the transition metal is carried out using DC magnetron sputtering.

5. The method of claim 1, wherein, during the plasma-enhanced chemical vapor deposition, a chamber pressure is adjusted between 1.5 Torr and 2.5 Torr at least partly attributable to the inert gas plasma.

6. The method of claim 1, wherein a temperature is adjusted between 700° C. and 900° C. during the plasma-enhanced chemical vapor deposition.

7. The method of claim 1, wherein the electromigration-resistant crystalline transition-metal silicide layer is tempered at a temperature of more than 900° C.

8. The method of claim 1, further comprising dinitrogen monoxide (N2O) to the inert gas plasma.

9. The method of claim 1, patterning the electromigration-resistant crystalline transition-metal silicide layer into a micro heater.

10. The method of claim 9, wherein the patterning is performed using ion-beam etching with a photolithographic mask.

11. A layered arrangement comprising:
a semiconductor substrate that includes an electrically insulating layer;
a transition metal on the electrically insulating layer; and
an electromigration-resistant crystalline transition-metal silicide layer formed by a chemical reaction of the transition metal with gaseous silicon formed by a decomposition of monosilane (SiH4) in an inert gas plasma.

12. A sensor comprising:
an electromigration-resistant crystalline transition-metal silicide layer,
wherein the electromigration-resistant crystalline transition-metal silicide layer is part of a layered arrangement of the sensor, the layered arrangement including:
the electromigration-resistant crystalline transition-metal silicide layer;
a semiconductor substrate that includes an electrically insulating layer; and
a transition metal on the electrically insulating layer.

13. The sensor of claim 12, wherein the sensor is a gas sensor.

14. The sensor of claim 12, wherein the sensor is a lambda sensor.

15. The sensor of claim 12, wherein the sensor is a MEMS sensor.

16. The sensor of claim 12, wherein the sensor is a pressure sensor.

17. The sensor of claim 12, wherein the electromigration-resistant crystalline transition-metal silicide layer is arranged as a micro heater.

18. The sensor of claim 17, wherein the micro heater is patterned.

19. A sensor comprising:
an electromigration-resistant crystalline transition-metal silicide layer,
wherein the electromigration-resistant crystalline transition-metal silicide layer is part of a layered arrangement of the sensor, the layered arrangement including:
the electromigration-resistant crystalline transition-metal silicide layer;
a semiconductor substrate that includes an electrically insulating layer; and
transition metal on the electrically insulating layer and that chemically reacts with gaseous silicon formed by a decomposition of monosilane (SiH4) in an inert gas plasma, thereby forming the electromigration-resistant crystalline transition-metal silicide layer.

* * * * *